United States Patent [19]

Hill et al.

[11] Patent Number: 5,182,488
[45] Date of Patent: Jan. 26, 1993

[54] ELECTRON BEAM GUN FOR USE IN AN ELECTRON BEAM EVAPORATION SOURCE

[75] Inventors: Russell J. Hill, El Cerrito; P. A. Joel Smith, San Pablo, both of Calif.

[73] Assignee: The BOC Group, Inc., New Providence, N.J.

[21] Appl. No.: 750,363

[22] Filed: Aug. 27, 1991

[51] Int. Cl.$^5$ ............... H01J 29/46; B23K 15/00
[52] U.S. Cl. .................. 313/446; 313/456; 313/326; 219/121.27; 373/13; 430/942
[58] Field of Search ............ 313/446, 448, 456, 452, 313/326; 430/942; 373/13; 219/121.27, 121.15, 121.31

[56] References Cited

U.S. PATENT DOCUMENTS

| | | | |
|---|---|---|---|
| 2,956,192 | 10/1960 | Heil et al. | 313/446 |
| 3,878,424 | 4/1975 | Suganuma | 313/446 X |
| 4,048,462 | 9/1977 | Hill et al. | 219/121.31 X |
| 4,866,239 | 9/1989 | Egermeier | 219/121.15 |
| 5,012,064 | 4/1991 | Chang et al. | 219/121.15 X |

FOREIGN PATENT DOCUMENTS 1789187  2/1977  Fed. Rep. of Germany ...... 313/446

OTHER PUBLICATIONS

STIH0270-1, Turret Super SOURCE, Temescal part of The BOC Group, Inc., pp. 153, Jul. 1985.

Primary Examiner—Donald J. Yusko
Assistant Examiner—Ashok Patel
Attorney, Agent, or Firm—David M. Rosenblum; Larry R. Cassett; David A. Draegert

[57] ABSTRACT

The present invention provides an electron beam gun for an electron beam evaporation source in which a beam former shields a filament from an anode such that electrons emitted from the filament are accelerated past the anode in a ribbon-like beam. The filament is connected to a split cathode block having two sides for applying an electric current through the filament. The beam former has two sections which are separately connected to the two sides of the cathode block such that the cathode block acts as a heat sink for the beam former, and a thermal gradient is not produced within the beam former that would produce warpage and movement of the beam former. Preferably, the vertical gap is about 0.254 mm. to prevent electrons emitted from the filament from arcing through the gap to the anode.

3 Claims, 3 Drawing Sheets

ELECTRON BEAM GUN FOR USE IN AN ELECTRON BEAM EVAPORATION SOURCE

BACKGROUND OF THE INVENTION

The present invention relates to an electron beam gun for an electron beam evaporation source of the type used in depositing a thin film of evaporated material onto a substrate. More particularly, the present invention relates to such an electron beam gun in which a beam former used in generating a ribbon-like electron beam to melt and evaporate the material is formed in two sections that are separately connected to a split cathode block to prevent thermal deformation of the beam former. The prevention of thermal deformation of the beam former increases the service life the electron beam gun.

In the prior art, electron beam evaporation sources employ an electron beam gun located beneath a crucible containing a material to be evaporated. The evaporated material is subsequently deposited onto a substrate held above the evaporation source. In such evaporation sources, the electron beam gun emits a ribbon-like beam that is magnetically deflected through an arc of 270° and into the crucible to melt and evaporate the material.

The electron beam gun employs a filament connected to a split cathode block having two sides. An anode having a top section of 'U' shaped cross-section passes over the filament and terminates in a front edge spaced from and located in front of the filament. The beam former is located between the anode and the filament and is configured so that the filament is shielded from the anode. When an electrical current is applied to the filament through the cathode block, the filament emits electrons which because of the shielding of the beam former are constrained to pass beneath the beam former and toward the front edge of the anode in a ribbon-like electron beam. By the time the electrons reach the anode a sufficient kinetic energy has been imparted to the electrons to cause the electrons to miss the anode and thereby to be emitted from the electron beam gun. The ribbon-like beam emitted by the electron beam gun is deflected by magnetic pole pieces of the evaporation source into the crucible.

The beam former, which has essentially the same shape of the anode, is connected to one of the sides of the cathode block and insulated from the other of the sides of the cathode block by an insulator. The cathode block acts as a heat sink to the beam former, but since the beam former is only connected to one side of the cathode block, a thermal gradient is produced across the beam former. The resultant unequal heat distribution within the beam former causes the beam former to warp and move. Such warpage and movement can cause the beam former to rise above the lower front edge of the anode and thus cause electrons to directly arc into the anode, destroying the anode. In addition, the warpage and movement of the beam former can deform the beam. Such deformation can change the impact area, and thus, produce a non-uniform evaporation of the material to be evaporated.

As will be discussed, the present invention provides an improved electron beam gun in which the beam former and its attachment to the cathode block are designed to prevent the production of thermal gradient across the beam former to in turn prevent warpage and movement of the beam former.

SUMMARY OF THE INVENTION

The present invention provides an electron beam gun for use in an electron beam evaporation source. The electron beam gun includes a split cathode block having two electrically conductive sides. A filament is connected to the two sides of the cathode block so that an electric current applied to the two sides of the cathode block causes the filament to emit electrons. An anode is provided to accelerate the electrons. The anode has an outer top section of 'U' shaped cross-section passing over the filament and terminating in a front edge located in front of the filament. A beam former is located between the anode and the filament and is configured so that the filament is shielded from the anode and the electrons are constrained to pass beneath the beam former and toward the anode in a ribbon-like electron beam. The beam former is fabricated in two sections with a vertical gap between the sections. The two sections are separately connected to the two sides of the cathode block such that the two sections of the beam former are in good thermal contact with the two sides of the cathode block and the two sides of the cathode block act as a heat sink for the two sections of beam former. As a result, a non-uniform thermal gradient is not produced within the beam former which can cause warpage and movement of the beam former. The gap is sized such that the electrons emitted from the filament cannot pass through the gap directly to the anode.

BRIEF DESCRIPTION OF THE DRAWINGS

While the specification concludes with claims distinctly pointing out the subject matter that Applicants regard as their invention, it is believed the invention will be better understood from the following description taken in conjunction with the accompanying drawings, in which:

DETAILED DESCRIPTION OF THE DRAWINGS

Figure 1:
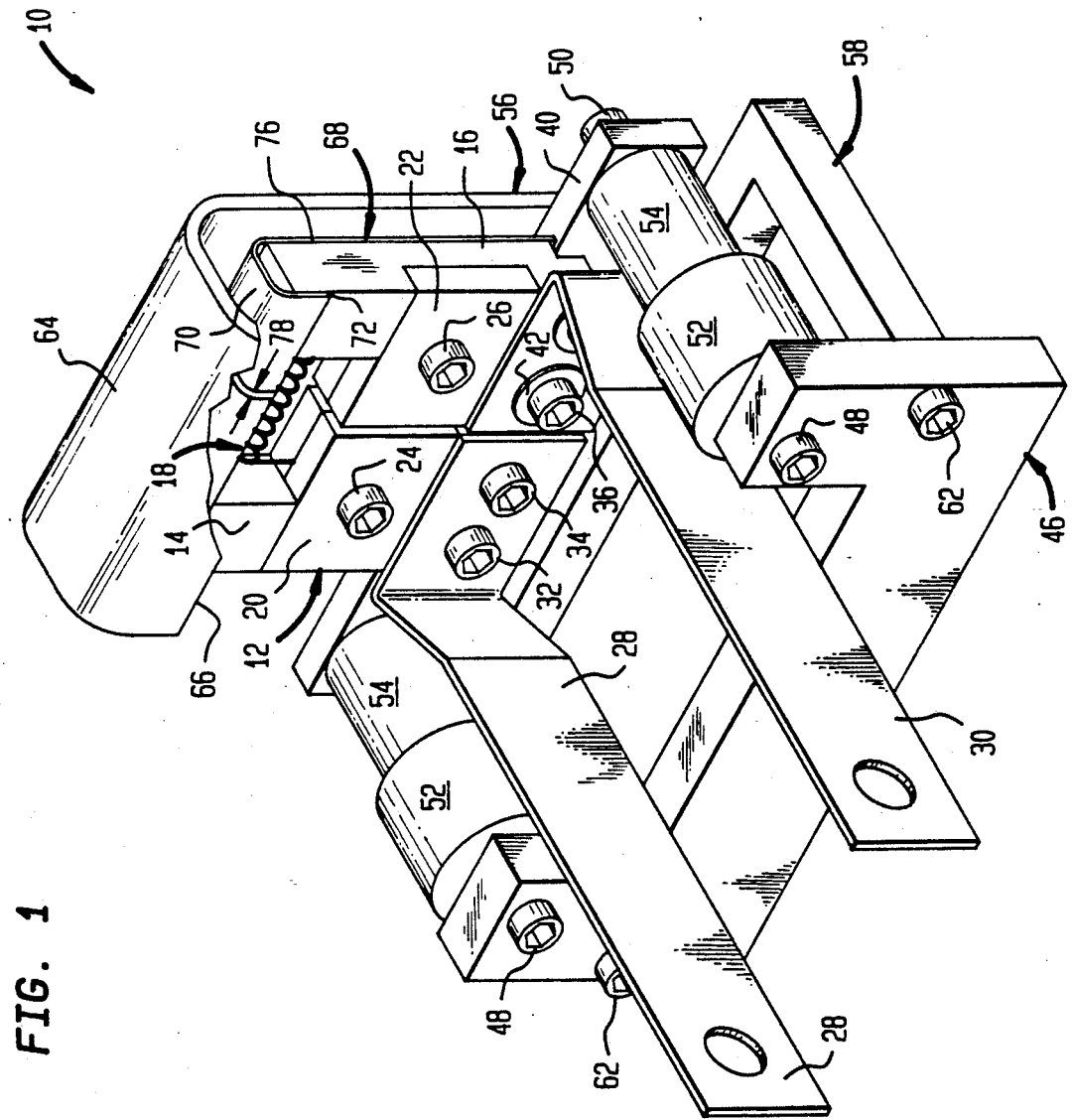
FIG. 1 is a perspective view of an electron beam gun in accordance with the present invention with portions of an anode thereof broken away to illustrate a beam former used in forming an electron beam.
Figure 3:
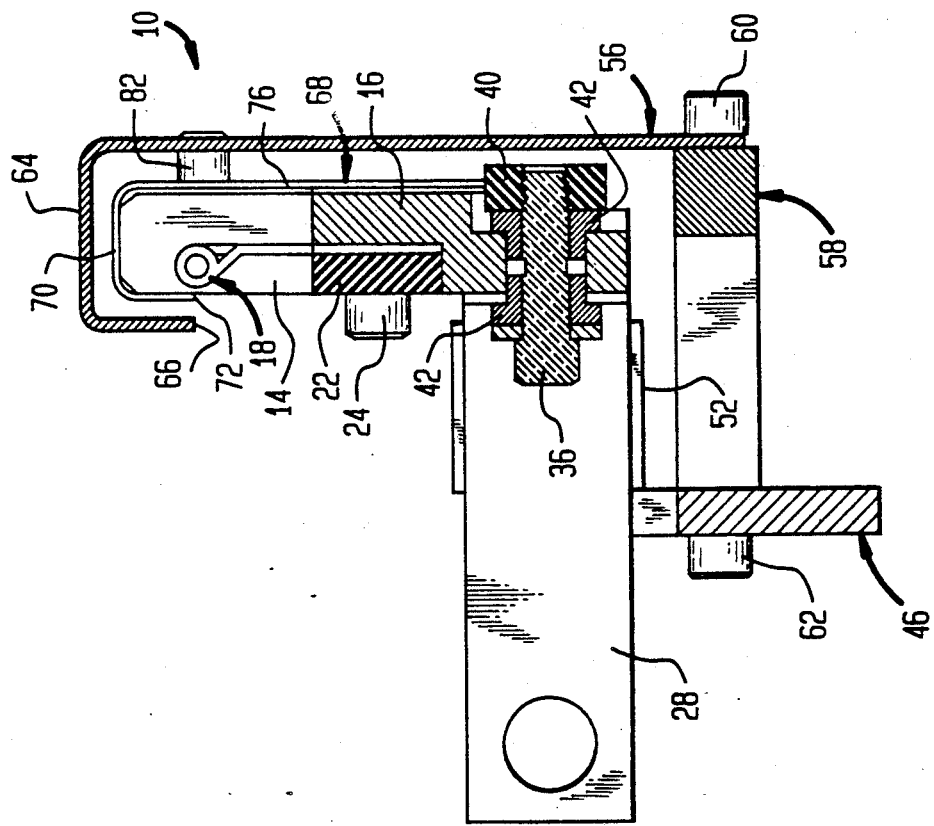
FIG. 3 is a sectional view of FIG. 2 taken along line 3—3 of FIG. 2.
Figure 2:
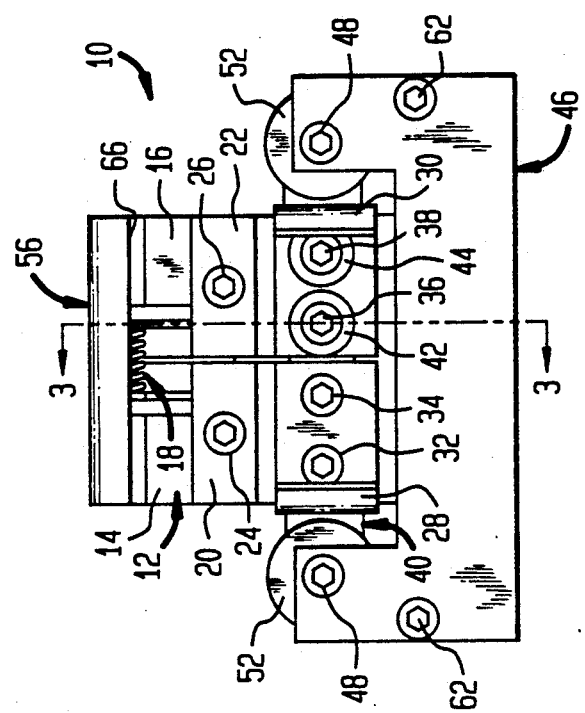
FIG. 2 is a front view of FIG. 1.
Figure 4:
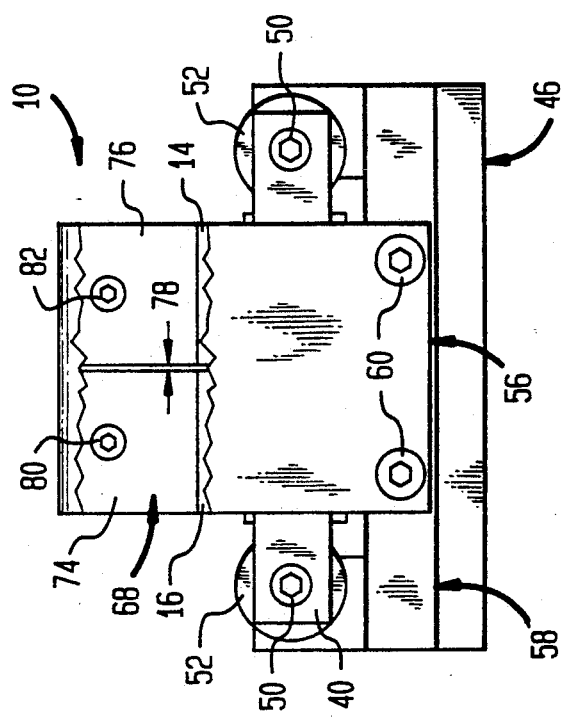
FIG. 4 is a rear view of FIG. 1 with portions of the anode broken away.

With reference to the figures, an electron beam gun 10 in accordance with the present invention is illustrated. Electron beam gun 10 is a modified electron beam gun known to those skilled in the art and widely used in 270° electron beam evaporation sources.

Electron beam gun 10 is provided with a cathode block 12 having two conductive sides 14 and 16 spaced slightly apart from one another. A filament 18 is connected to sides 14 and 16 of filament block 12 by two filament clamps 20 and 22, affixed to the two sides 14 and 16 of cathode block 12 by screws 24 and 26. Two filament bus bars 28 and 30 are in turn connected to sides 14 and 16 of filament block 12 to apply an electric current across sides 14 and 16 of cathode block 12, and thus, filament 18. The electric current causes filament 18 to emit electrons.

Filament bus bars 28 and 30 are in turn connected by screws 32, 34, 36 and 38 to mounting bar 40. Cathode block 12 is insulated from mounting bar 40 by provision of 2 sets of insulative washer pairs 42 and 44, through which screws 36 and 38 extend. As may be appreciated, one of the filament blocks must be insulated from mounting bar 40 to prevent sides 14 and 16 of cathode block 12 from being shunted. Mounting bar 40 is in turn connected at its ends to a support bar 46 by screws 48 and 50 which pass through insulator pairs 52 and 54. Insulator 54 slides into shield 52 in a manner well known in the art.

An anode 56 is provided to accelerate electrons emitted by filament 18. Anode 56 is connected at the bottom to anode mounting bracket 58 by screws 60. Anode mounting bracket 58, at its ends, is in turn attached to support bar 46 by screws 62. Anode 56 has a top portion 64 of inverted U-shaped configuration which terminates in a front edge 66 in front of filament 18.

A beam former 68 is provided. Beam former 68 is configured to shield filament 18 from anode 56. In this regard, beam former 68 is located between filament 18 and anode 56, and has essentially the same shape as anode 56. That is, it has a top portion 70 of inverted U-shaped configuration terminating in a lower edge 72 located between lower edge 66 of anode 56 and filament 18.

The shielding provided by beam former 68 causes electrons emitted by filament 18 to form an electron cloud under top portion 70 of beam former 68. As a result, a virtual cathode is formed from which electrons pass beneath lower edge 72 of beam former 68 in a flat ribbon-like configuration toward lower edge 66 of anode 56. By the time electrons reach lower edge 66 of anode 56, a sufficient kinetic energy has been imparted such that the ribbon-like beam misses anode 56 and is emitted from electron beam gun 10.

In the prior art, beam former 68 was formed in a single section and was connected to side 14 of cathode block 12. The other side of beam former 68 was insulated from side 16 of cathode block 12 to prevent cathode block 12 from being shunted. The end result of this was that a thermal gradient was produced within beam former 68 in which beam former 68 was coolest at its attachment to side 14 of cathode block 12, and hottest at the insulator, insulating beam former 68 from side 16 of cathode block 12.

The thermal gradient was found to cause warpage and movement of beam former 68. For instance, rotational movement of beam former 68 caused lower front edge 72 thereof to raise itself above lower front edge 66 of anode 56 to in turn cause electrons emitted from filament 18 to directly arc and strike anode 56, resulting in its eventual destruction. Other rotational movements caused deformation of the ribbon-shaped beam to produce non-uniform evaporation as electron beam gun aged over its surface life.

In order to prevent this, in electron beam gun 10, beam former 68 is formed in two sections 74 and 76 separated by a gap 78. Sections 74 and 76 of beam former 68 are separately connected to sides 14 and 16 of cathode block 12 by screws 80 and 82. Although not illustrated, anode 56 is provided with apertures to accommodate the screw heads of screws 80 and 82.

The spacing of gap 78 is critical. For instance, if gap 78 were too wide, electrons would flow directly to anode 56. It has been found by the inventors herein that such gap in an electron beam gun designed to operate between 4 and 11 KV, at between about 3 and 20 KW, should be between about 0.127 mm. and 0.254 mm., with 0.254 mm. being preferred.

While a preferred embodiment of the invention has been shown and described in detail, it will be readily understood and appreciated by those skilled in the art, that numerous omissions, changes and additions may be made without departing from the spirit and scope of the invention.

We claim:

1. In an electron beam gun for use in an electron beam evaporation source including: a split cathode block having two electrically conductive sides; a filament located between the two sides of the cathode block and connected to the two sides of the cathode block so that an electric current applied to the sides of the cathode block causes the filament to emit electrons; an anode having a top section of inverted U shaped cross-section passing over the filament and terminating in a front edge located in front of the filament; and a beam former having a top section of inverted U shaped cross-section, located between the anode and the filament and configured so that the filament is shielded from the anode and the electrons are constrained to pass beneath the top section of the beam former and toward the front edge of the top section of the anode in a ribbon shaped electron beam, the improvement comprising:

the beam former having two sections with a vertical gap between the sections;

the two sections separately connected to the two sides of the cathode block so that the two sections of the beam former are in good thermal contact with the two sides of the cathode block and the two sides of the cathode block act as heat sinks for the two sections of the beam former to prevent a non-uniform thermal gradient from being produced within the beam former and consequent thermal warpage and movement of the beam former; and the gap between the two sections of the beam former sized such that electrons cannot pass through the gap to the anode.

2. The improvement of claim 1, wherein the gap is in a range of between about 0.127 mm. and 0.254 mm.

3. The improvement of claim 1, wherein the gap is about 0.254 mm.

* * * * *